(12) United States Patent
Yoshida et al.

(10) Patent No.: US 8,437,376 B2
(45) Date of Patent: May 7, 2013

(54) NITRIDE SEMICONDUCTOR LIGHT-EMITTING DEVICE

(75) Inventors: Shinji Yoshida, Shiga (JP); Kenji Orita, Osaka (JP); Yoshiaki Hasegawa, Okayama (JP); Atsunori Mochida, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/294,682

(22) Filed: Nov. 11, 2011

(65) Prior Publication Data

US 2012/0057612 A1  Mar. 8, 2012

Related U.S. Application Data

(63) Continuation of application No. PCT/JP2010/000262, filed on Jan. 19, 2010.

(30) Foreign Application Priority Data

May 20, 2009  (JP) .................................. 2009-122287

(51) Int. Cl.
*H01S 5/00*  (2006.01)

(52) U.S. Cl.
USPC ...................................................... 372/49.01

(58) Field of Classification Search ................ 372/49.01
See application file for complete search history.

(56) References Cited

U.S. PATENT DOCUMENTS

| 2004/0238810 | A1 | 12/2004 | Dwilinski et al. |
| 2004/0251471 | A1 | 12/2004 | Dwilinski et al. |
| 2004/0261692 | A1 | 12/2004 | Dwilinski et al. |
| 2005/0249255 | A1 | 11/2005 | Dwilinski et al. |
| 2006/0133442 | A1 | 6/2006 | Kondou et al. |
| 2007/0040240 | A1 | 2/2007 | Dwilinski et al. |
| 2007/0177646 | A1 | 8/2007 | Sogabe et al. |
| 2007/0246720 | A1 | 10/2007 | Kamikawa et al. |
| 2008/0108162 | A1 | 5/2008 | Dwilinski et al. |
| 2008/0181274 | A1 | 7/2008 | Michiue et al. |
| 2008/0304530 | A1 | 12/2008 | Morizumi |

FOREIGN PATENT DOCUMENTS

| JP | 2-288287 A | 11/1990 |
| JP | 2006-203162 | 8/2006 |
| JP | 2007-201373 | 8/2007 |
| JP | 2007-318088 | 12/2007 |
| JP | 2008-147363 | 6/2008 |
| JP | 2008-182208 | 8/2008 |
| JP | 2009-016798 | 1/2009 |
| WO | WO 03/036771 A1 | 5/2003 |

OTHER PUBLICATIONS

International Search Report issued in International Patent Application No. PCT/JP2010/000262 dated Mar. 9, 2010.

*Primary Examiner* — Yuanda Zhang
(74) *Attorney, Agent, or Firm* — McDermott Will & Emery LLP (57) ABSTRACT

A nitride semiconductor device includes a multilayer semiconductor structure made of a group III nitride semiconductor and having a light-emitting facet, and a first coating film formed to cover the light-emitting facet of the multilayer semiconductor structure. The first coating film is a crystalline film made of a nitride containing aluminum. The crystalline film is composed of a group of single domains, and the single domain is comprised of a group of grains whose crystal orientation planes have a same inclination angle and a same rotation angle. A length of a boundary between the domains per unit area is 7 $\mu m^{-1}$ or less.

9 Claims, 11 Drawing Sheets

LENGTH ALONG EXTENSION DIRECTION OF CAVITY (nm)

FIG. 16
PRIOR ART

NITRIDE SEMICONDUCTOR LIGHT-EMITTING DEVICE

CROSS-REFERENCE TO RELATED APPLICATION

This is a continuation of PCT International Application PCT/JP2010/000262 filed on Jan. 19, 2010, which claims priority to Japanese Patent Application No. 2009-122287 filed on May 20, 2009. The disclosures of these applications including the specifications, the drawings, and the claims are hereby incorporated by reference in their entirety.

BACKGROUND

The present disclosure relates to nitride semiconductor light-emitting devices, specifically relates to nitride semiconductor light-emitting devices in which a protection film is provided on a light-emitting facet.

Among semiconductor light-emitting devices, semiconductor laser diodes are widely used as a light source for playback and record of optical disc media, such as a compact disc (CD), a digital versatile disc (DVD), and a Blu-ray Disc (registered trademark). Because high-speed information recording is required, higher output power of the semiconductor laser diodes is particularly necessary so that much information can be recorded in short time.

However, it has been generally known that if optical output of the semiconductor laser diode is increased, a phenomenon in which no laser oscillation occurs in the semiconductor laser diode occurs due to a degradation phenomenon in which an operating current gradually increases, or a phenomenon called optical damage. Thus, to increase the output power, techniques for reducing or preventing such degradation of the semiconductor laser diode are being actively researched and developed. In particular, sudden death due to optical damage occurs at a front facet, which is a light-emitting facet of a laser cavity. Thus, efforts are being made to increase strength and stability of the protection film which covers a facet of the cavity. In general, a facet of a cavity of a semiconductor laser diode is covered with a protection film to control a reflection coefficient at the facet of the cavity, and avoid adhesion of foreign substances and oxidation of the facet of the cavity.

Figure 16:
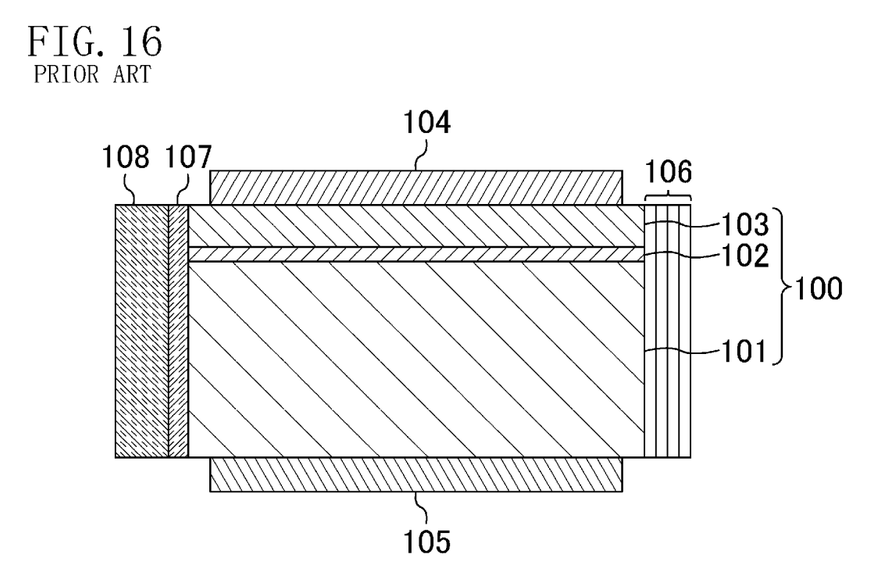
FIG. 16 is a schematic cross-sectional view of a conventional nitride semiconductor laser diode.

FIG. 16 schematically shows a cross-sectional structure of a conventional nitride semiconductor laser diode disclosed in Patent Document 1 (Japanese Patent Publication No. 2007-318088). As shown in FIG. 16, the conventional nitride semiconductor laser diode includes a laser structure 100 in which an active layer (light-emitting layer) 102 is sandwiched between an n-type semiconductor layer 101 and a p-type semiconductor layer 103. A p-side electrode 104 is formed on the p-type semiconductor layer 103. An n-side electrode 105 is formed on the n-type semiconductor layer 101.

A protection film 106 made of a metal oxide such as silicon oxide ($SiO_2$) or aluminium oxide ($Al_2O_3$) is provided on a rear facet which serves as a mirror of the cavity in the laser structure 100. Further, aluminum nitride (AlN) is used as a first protection film 107 provided on a front facet of the cavity, and aluminium oxide ($Al_2O_3$) is used as a second protection film 108 provided on the outer side of the first protection film 107.

It is considered that one of the reasons why semiconductor laser diodes with higher output power deteriorate is due to an interface reaction at the facet of the cavity, such as a solid phase reaction caused between the first protection film 107 etc. and the facet of the semiconductor by the heat generated by the laser structure 100 and the light absorbed by the laser structure 100, or oxidation of the facet of the cavity caused by the oxygen remaining in the protection films, or oxygen in the package, diffusing in the protection films concurrently with laser oscillation.

Further, heat generated by the laser oscillation may cause the protection films to separate from the laser structure 100, or cause cracks in the laser structure 100, and the laser structure 100 is physically broken. The first protection film 107 made of AlN, which is shown in FIG. 16 as a conventional protection film, is a crystalline thin film. Therefore, the first protection film 107 made of AlN is strong, having a high thermal conductivity, and a superior material as a facet coating film. Moreover, since both of AlN and a nitride semiconductor are a nitride, a solid phase reaction between the AlN and the laser structure 100 is reduced.

However, the film stress of the AlN film is high. Thus, cracks etc. may be easily caused by laser oscillation. Further, it has been known that a light absorption band exists in the AlN near the wavelength of 400 nm due to a defect or the like, and the light absorption at the time of laser oscillation is considered as generating heat and causing diffusion of oxygen.

In view of this, Patent Document 2 (Japanese Patent Publication No. 2008-182208) discloses an AlN film having a structure which reduces film stress, and a method for forming such the AlN film. In Patent Document 2, AlN films each having different crystal orientation are layered to reduce the film stress, and prevent cracks and film separation due to heat.

Patent Document 3 (Japanese Patent Publication No. 2008-147363) discloses a structure in which AlN doped with a rare earth element is used as a protection film to reduce diffusion of oxygen. After the AlN is doped with a rare earth, the rare earth element is coupled with oxygen. It is therefore possible to reduce diffusion of the oxygen. By using such the AlN film doped with a rare earth element, it is possible to prevent the oxidation of the facet of the cavity and the film separation of the facet of the cavity, and reduce optical damage and deterioration of the facet. As a result, it is possible to perform laser operation for a longer time, compared to the case in which a general AlN film is used.

SUMMARY

However, although film separation or occurrence of cracks can be reduced in the AlN film disclosed in Patent Document 2, the AlN disclosed in Patent Document 2 has a problem in which film optical damage may occur due to such as oxidation of the facet caused by heat generation and light absorption at the facet. In Patent Document 2, AlN films each having different crystal orientation are layered. Therefore, an interface is created between the AlN films each having different crystalline, which will be a cause of light absorption. Further, the AlN film disclosed in Patent Document 1 is a polycrystalline film, and light absorption occurs at the interface between grains. Such the light absorption by the AlN film causes the generation of heat at the facet of the cavity, and diffusion of oxygen in the AlN film, which lead to optical damage. Thus, such the light absorption may be a cause of a reduction in reliability of the semiconductor laser diode.

The AlN film of Patent Document 3 which is doped with a rare earth element such as yttrium (Y) also has a problem of deterioration or optical damage of the facet of the cavity. These may be caused because grains of the AlN film are reduced in size by the doping of Y, which in turn increases an area of the interface between the grains, and as a result, light absorption of the AlN film is increased. Since the AlN film is a crystalline film, deterioration due to heat and light is small.

However, generation of heat and diffusion of oxygen due to light absorption cause deterioration of the facet of the cavity, and therefore can be a cause of a reduction in lifetime and reliability of the semiconductor laser diode.

The present disclosure was made to solve the above problems, and it is an objective of the present disclosure to provide a facet protection film in which less light absorption occurs and no optical damage is caused even during a high power output operation.

To achieve the above objective, a nitride semiconductor light-emitting device of the present disclosure is configured such that a crystalline film made of a nitride containing aluminum is used as a facet protection film, and that the crystalline film is comprised of a group of domains each of which has a certain size and whose crystal orientation planes have a same inclination angle and a same rotation angle. The term "domain" will be defined later.

Specifically, a first nitride semiconductor light-emitting device according to the present disclosure includes a multilayer semiconductor structure made of a group III nitride semiconductor and having a light-emitting facet, and a first protection film formed to cover the light-emitting facet of the multilayer semiconductor structure, wherein the first protection film is a crystalline film made of a nitride containing aluminum, the crystalline film is comprised of a group of single domains, the single domain is comprised of a group of grains whose crystal orientation planes have a same inclination angle and a same rotation angle, and a length of a boundary between the domains per unit area is 7 $\mu m^{-1}$ or less.

In the first nitride semiconductor light-emitting device, the length of each domain boundary per unit area of the first protection film having crystals made of a nitride containing aluminum is 7 $\mu m^{-1}$ or less. In other words, a single domain has a large area. Therefore, the area of an interface between domains per unit area is reduced, which leads to a reduction in light absorption, and a reduction in heat generation and oxygen diffusion during operation. As a result, it is possible to achieve a nitride semiconductor light-emitting device which has high output power and a long life.

A second nitride semiconductor light-emitting device according to the present disclosure includes a multilayer semiconductor structure made of a group III nitride semiconductor and having a light-emitting facet, and a first protection film formed to cover the light-emitting facet of the multilayer semiconductor structure, wherein the first protection film is a crystalline film made of a nitride containing aluminum, the crystalline film is comprised of a group of single domains, the single domain is comprised of a group of grains whose crystal orientation planes have a same inclination angle and a same rotation angle, and part of the plurality of domains which is opposed to a light transmission area of the light-emitting facet has an area larger than an area of the light transmission area.

In the second nitride semiconductor light-emitting device, the first protection film having crystals made of a nitride containing aluminum is comprised of a group of a plurality of domains whose crystal orientation planes have a same inclination angle and a same rotation angle, and part of the plurality of domains which is opposed to a light transmission area of the light-emitting facet has an area larger than an area of the light transmission area. With this structure, light emitted from the light-emitting facet is not absorbed or scattered due to an interface between the domains. Thus, the heat generation, the diffusion of oxygen, and the optical loss due to light dispersion can be reduced with reliability during operation. As a result, it is possible to achieve a nitride semiconductor light-emitting device which has high output power and a long life.

In the first or second nitride semiconductor light-emitting device, it is preferable that the first protection film includes single domains in which a difference between the inclination angles of the crystal orientation planes is 2° or less, and a difference between the rotation angles of the crystal orientation planes is 2° or less.

With this structure, a single domain in the first protection film is increased in size, and it is possible to reduce the area of the interface.

In the first or second nitride semiconductor light-emitting device, the first protection film may have a crystalline structure whose crystal axis orientation is the same as a crystal axis orientation of the multilayer semiconductor structure.

With this structure, the film stress applied by the first protection film to the multilayer semiconductor structure can be reduced. As a result, it is possible to prevent the separation of the first protection film and occurrence of cracks in the first protection film.

In the first or second nitride semiconductor light-emitting device, the first protection film may have a crystalline structure whose crystal axis orientation is different from a crystal axis orientation of the multilayer semiconductor structure.

With this structure, it is possible to further reduce the light absorption coefficient of the first protection film.

In the first or second nitride semiconductor light-emitting device, the multilayer semiconductor structure may have a hexagonal crystalline structure, the light-emitting facet may be an m-plane, and the first protection film may have a c-axis orientation.

With this structure, the light absorption coefficient of the first protection film is reduced.

The first or second nitride semiconductor light-emitting device may further include a second protection film formed to cover the first protection film, and the second protection film may be an amorphous film containing oxygen.

With this structure, stress of the light-emitting facet is reduced by the amorphous second protection film. Thus, it is possible to prevent the separation of the first protection film and the occurrence of cracks in the first protection film.

A nitride semiconductor light-emitting device according to the present disclosure includes a facet protection film in which less light absorption occurs and no optical damage is caused even during a high power output operation. Therefore, it is possible to ensure a long life and high reliability.

BRIEF DESCRIPTION OF THE DRAWINGS

FIG. 5A and FIG. 5B are electron backscatter diffraction image of first coating films made of AlN (AlN films) according to the first example embodiment of the present disclosure.

DETAILED DESCRIPTION

First Example Embodiment

The first example embodiment of the present disclosure will be described with reference to the drawings.

A nitride semiconductor light-emitting device according to the first example embodiment will be described as a gallium nitride (GaN) based blue-violet laser diode, together with a method for fabricating the laser diode.

Figure 1A:
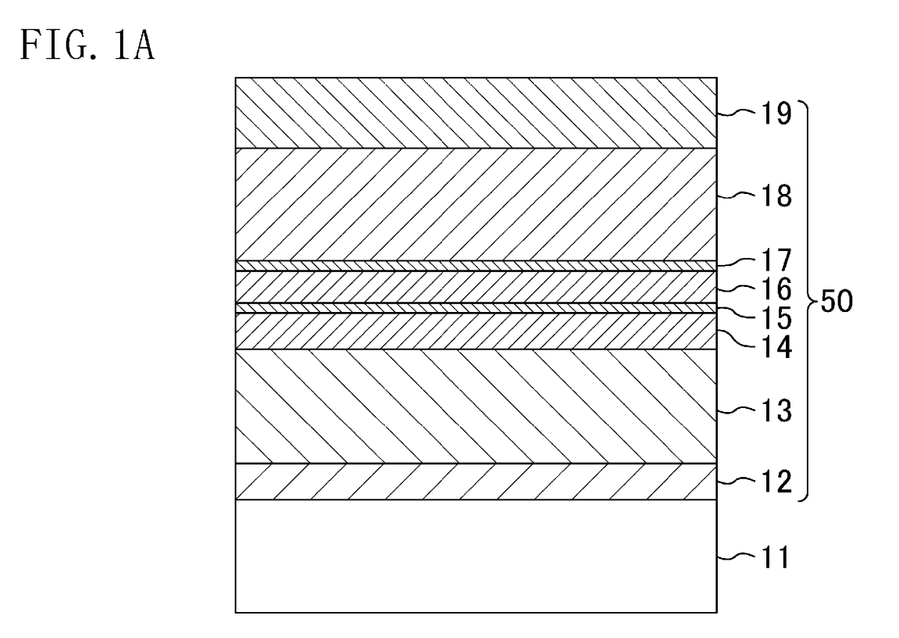
FIG. 1A and FIG. 1B are schematic cross-sectional views for sequentially showing the steps of a method for fabricating a nitride semiconductor light-emitting device according to the first example embodiment of the present disclosure.

First, as shown in FIG. 1A, a multilayer semiconductor structure 50 including a plurality of group III nitride semiconductor layers is epitaxially grown on an n-type substrate 11 made of n-type GaN, for example, by metal organic chemical vapor deposition (MOCVD).

Specifically, an n-type GaN layer 12 having a thickness of about 1 μm and doped with an n-type dopant Si at a concentration of $1\times10^{18}$ cm$^{-3}$, an n-type cladding layer 13 made of n-type $Al_{0.05}Ga_{0.95}N$ having a thickness of about 1.5 μm and doped with Si at a concentration of $5\times10^{17}$ cm$^{-3}$, an n-type optical guide layer 14 made of n-type GaN having a thickness of about 0.1 μm and doped with Si at a concentration of $5\times10^{17}$ cm$^{-3}$, a multiple quantum well active layer 15 made of InGaN, a p-type optical guide layer 16 made of p-type GaN having a thickness of about 0.1 μm and doped with a p-type dopant Mg at a concentration of $1\times10^{19}$ cm$^{-3}$, a p-type electron block layer 17 made of p-type $Al_{0.2}Ga_{0.8}N$ having a thickness of about 10 nm and doped with Mg at a concentration of $1\times10^{19}$ cm$^{-3}$, a p-type super lattice cladding layer 18 made of p-type AlGaN, and a p-type contact layer 19 made of p-type GaN having a thickness of about 20 nm and doped with Mg at a concentration of $1\times10^{20}$ cm$^{-3}$ are sequentially grown on a main surface of the n-type substrate 11, of which the main surface is a c-plane (i.e., a (0001) plane) of the plane orientation.

Here, the multiple quantum well active layer 15 has a triple quantum well structure including a well layer made of undoped InGaN and having a thickness of about 3 nm, and a barrier layer made of undoped $In_{0.02}Ga_{0.98}N$ and having a thickness of 7 nm. The In composition of the well layer is adjusted so that the oscillation wavelength will be 405 nm. The p-type super lattice cladding layer 18 has a super lattice structure including p-type $Al_{0.1}Ga_{0.9}N$ and p-type GaN, each having a thickness of about 2 nm and doped with Mg at a concentration of $1\times10^{19}$ cm$^{-3}$. The total film thickness of the p-type super lattice cladding layer 18 is 0.5 μm.

Figure 1B:
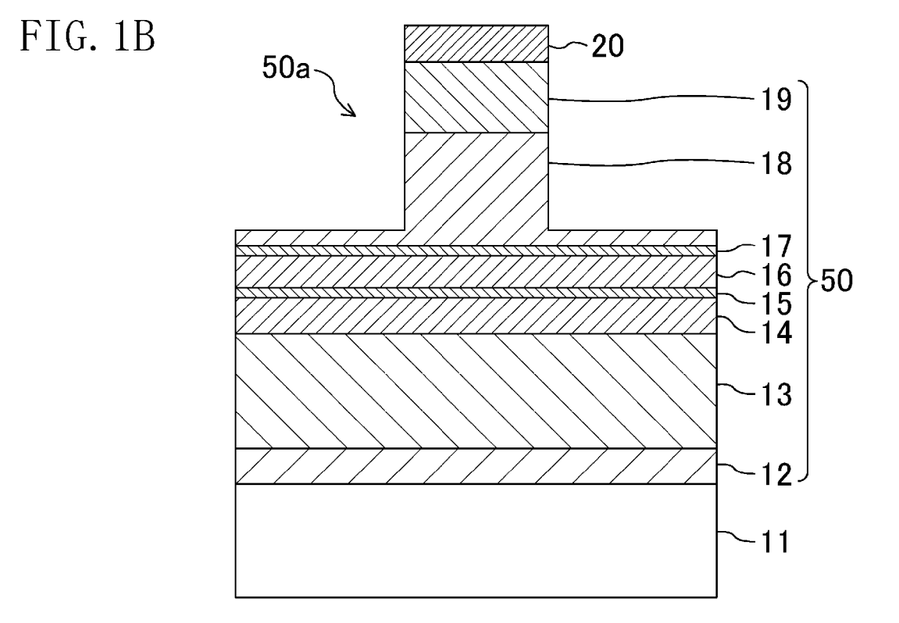

Next, as shown in FIG. 1B, a mask layer 20 made of $SiO_2$ is formed on the p-type contact layer 19. Then, the mask layer 20 is patterned into stripes extending in the <1-100> direction relative to a crystal axis of the n-type substrate 11 by lithography and etching. Using the mask layer 20 patterned into stripes, the p-type contact layer 19 and the p-type super lattice cladding layer 18 are dry etched to form a stripe-shaped ridge waveguide 50a extending in the <1-100> direction relative to the crystal axis in the p-type contact layer 19 and the p-type super lattice cladding layer 18. Here, the thickness of the p-type super lattice cladding layer 18 located at lateral sides of the ridge waveguide 50a (the thickness of the remaining portion) is about 0.1 μm. The width of the ridge waveguide 50a at a lower portion is about 2 μm. The width of the ridge waveguide 50a at an upper portion is about 1.4 μm.

Figure 2:
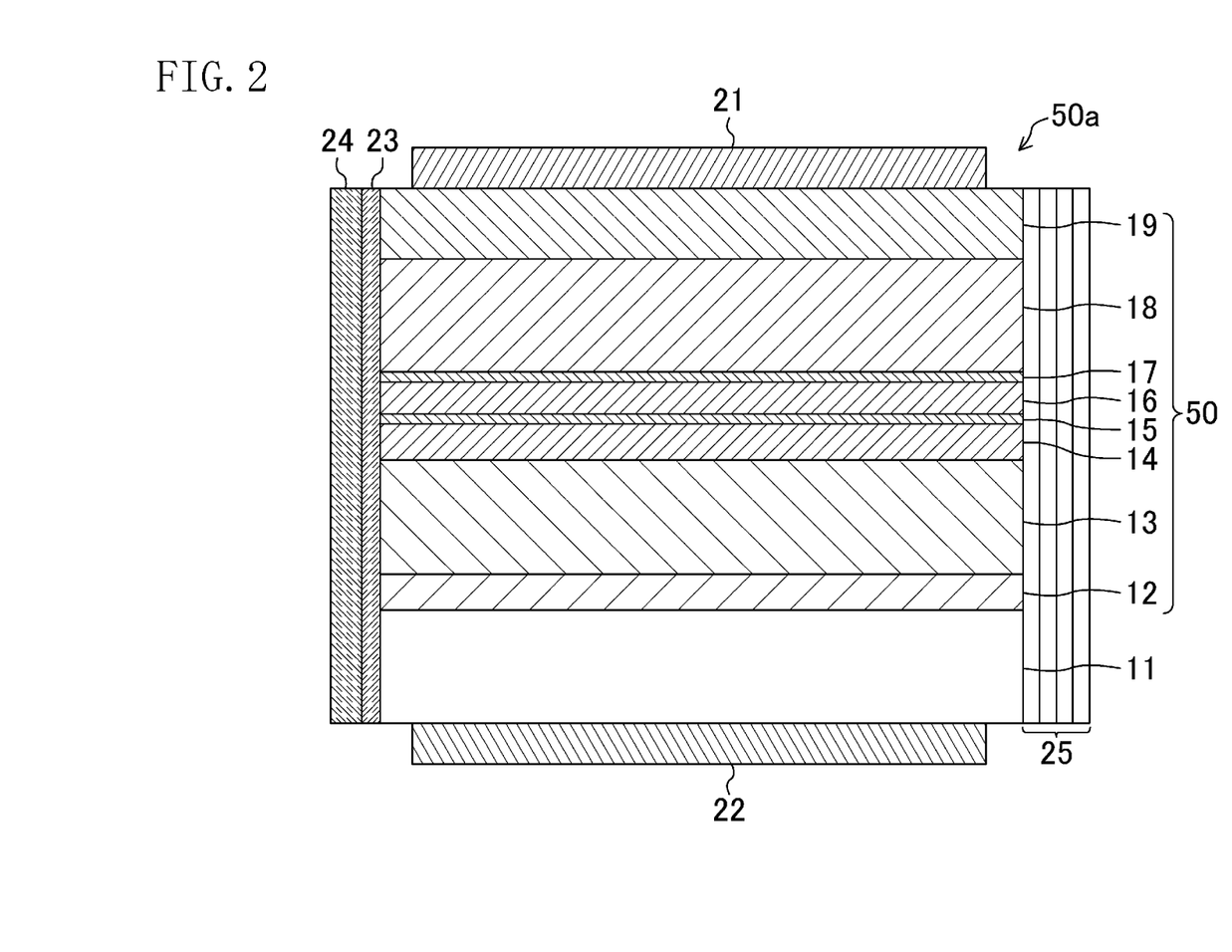
FIG. 2 is a schematic cross-sectional view showing the nitride semiconductor light-emitting device according to the first example embodiment of the present disclosure.

Then, the mask layer 20 is removed as shown in FIG. 2. After that, a p-side electrode 21 made of palladium (Pd) is formed on the p-type contact layer 19 forming the ridge waveguide 50a by lithography, vacuum evaporation, etc. Then, the thickness of the n-type substrate 11 is reduced (the back side of the n-type substrate 11 is ground) so that cleavage easily occurs. After that, an n-side electrode 22 made of titanium (Ti) is formed on the back side of the n-type substrate 11.

Then, the n-type substrate 11 and the multilayer semiconductor structure 50 are cleaved so that the cavity to be formed in the multilayer semiconductor structure 50 under the ridge waveguide 50a have a length of about 600 μm or about 800 μm. Due to this cleavage, a facet mirror whose plane orientation is a (1-100) plane is formed in the multilayer semiconductor structure 50. For simplicity, the minus signs "−" which are associated with indexes of the crystal axis and the plane orientation, represent the inversions of the indexes following the minus signs in the specification of the present application. Then, each facet of the cavity is provided with a coating film for preventing deterioration of the facet of the multilayer semiconductor structure 50, and adjusting the reflection coefficient of the facet.

Specifically, as shown in FIG. 2, a first coating film 23 made of aluminum nitride (AlN) as a first protection film is formed on the front facet from which laser light is emitted. An amorphous second coating film 24 made of aluminium oxide ($Al_2O_3$) as a second protection film is formed on the first coating film 23. A multilayer coating film 25 which includes a plurality of pairs of aluminium oxide ($Al_2O_3$)/zirconium oxide ($ZrO_2$) layers is formed on the rear facet opposed to the front facet. The rear facet may be provided with a plurality of pairs of AlON/$SiO_2$ layers, $Al_2O_3$/$SiO_2$ layers, or AlN/$Al_2O_3$ layers as long as a desired reflection coefficient can be obtained. Here, similar to the front facet, it is preferable to provide an AlN film on the rear facet, too, as a first protection film in contact with the rear facet. The AlN film is strong, and having a high thermal conductivity, and therefore, suitable as a protection film also for the rear facet from which no light is emitted. In the present example embodiment, a reflection coefficient at the front facet is about 10%, and a reflection coefficient at the rear facet is about 90%. The coating films formed on the front facet and the rear facet are designed to have appropriate thicknesses so that desired reflection coefficients can be obtained.

The first coating film 23 made of AlN according to the first example embodiment is formed by electron cyclotron resonance (ECR) sputtering. Other than the ECR sputtering, radio frequency (RF) sputtering or magnetron sputtering can be used.

In the ECR sputtering, since the cleaved facet of the multilayer semiconductor structure 50 is not directly irradiated with sputter ions, the density of crystal defect caused in the semiconductor surface by the ion irradiation can be reduced. Thus, the ECR sputtering is suitable as a method for forming a facet coating film in the semiconductor laser diode. The AlN film as the first coating film 23 can be formed by reactive sputtering using a combination of a sputtering target made of AlN and nitrogen ($N_2$) gas, or a combination of a sputtering target made of Al and nitrogen gas. In the embodiment, a metal target made of Al of which the degree of purity can be easily increased by metal refining is used in combination with argon (Ar) gas as reference gas, and nitrogen gas as reactive gas.

The thickness of the first coating film 23 is set to about 6 nm. If the AlN film is formed on the cleaved facet of the multilayer semiconductor structure 50 in a thickness of 50 nm or more, film separation occurs because the film stress of the AlN film is high. Also, to reduce the heat generation due to light absorption, the optical path length of light in the first coating film 23 is preferably short. Thus, the thickness of the first coating film 23 has to be 50 nm or less. On the other hand, if the AlN film is a thin film having a thickness of 3 nm or less, oxygen etc. may easily pass through the AlN film, and the facet of the multilayer semiconductor structure 50 may be oxidized. In addition, since a process for forming a thin film is difficult to control, the thin film may have an uneven thickness. For these reasons, the thickness of the first coating film 23 made of AlN is preferably between 3 nm and 50 nm, both inclusive.

Figure 3:
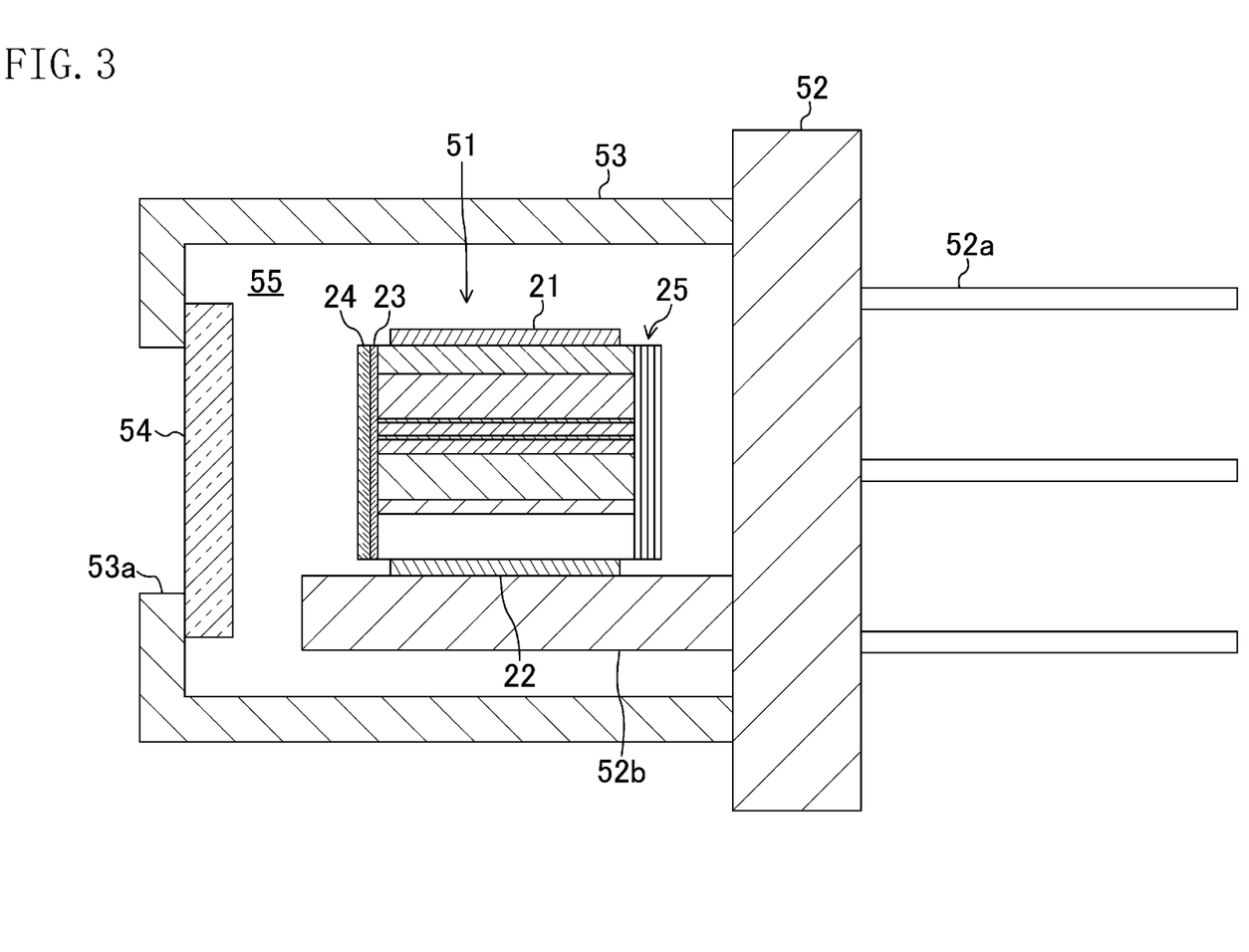
FIG. 3 is a schematic cross-sectional view of a packaged nitride semiconductor light-emitting device according to the first example embodiment of the present disclosure.

FIG. 3 shows a semiconductor laser diode 51 packaged after the formation of the coating films 23, 24, 25. As shown in FIG. 3, the semiconductor laser diode 51 is fixed, for example, to a laser holding portion 52b provided on one surface of a metal stem 52, on the other surface of which a plurality of electrode terminals 52a are provided. A metal cap 53 for enclosing the semiconductor laser diode 51 and the laser holding portion 52b, and having a window 53a at a location facing the front facet of the semiconductor laser diode 51, is fixed to the stem 52. A glass plate 54 is fixed to the window 53a from inside to seal the space surrounded by the stem 52 and the cap 53. The inner space of the sealed cap 53 is filled with gas 55 of dry air containing no moisture, or of an inert gas such as argon.

As described above, the first coating film 23 made of AlN according to the first example embodiment is formed by ECR sputtering using a metal target made of Al. The flow rate of each gas under this film formation condition is set to 30 ml/min for the argon (Ar) gas, and 5.2 ml/min for the nitrogen ($N_2$) gas, both under room temperature. In the first coating film 23 formed under this film formation condition, the size of each domain having the same orientation is relatively large, and therefore, an attenuation coefficient (an light absorption coefficient) which is an index representing light absorption of a material is small. Thus, the heat generated by the light absorption during a laser operation, diffusion of oxygen, and oxidation of the facet are reduced. As a result, it is possible to prevent deterioration of the facet of the cavity.

Now, a crystalline domain of the AlN film forming the first coating film 23 will be described in detail below. Here, the term "domain" is used to mean a group of grains having the same crystalline structure and the same orientation (the same crystal axis orientation), and the same orientation plane and the same angle of orientation. The inventors of the present application found that the domain size in the AlN film is significantly affected by the film formation condition during the ECR sputtering. Under the film formation condition according to the present example embodiment, it is possible to form an AlN film whose domain size is large. The film formation condition according to the present example embodiment is one example, and the film formation condition for forming an AlN film whose domain size is large is not limited to this film formation condition according to the present example embodiment.

The inventors of the present application found that there was a correlation between the domain size of the facet protection film and an output at which optical damage occurs. Now, a domain boundary length as a parameter indicating the domain size is defined. The domain boundary length is a parameter indicating a total length of an interface between domains per unit area. Here, a single domain is defined as a continuous region in crystals having the same orientation, in which region planes of orientation have the same inclination angle and the same rotation angle. If even one of the inclination angle and the rotation angle of the orientation plane is not the same, it means that there exist different domains, and thus there exists a boundary. A total length ($\mu m$) of the boundary between these domains per unit area ($\mu m^{-2}$) corresponds to the domain boundary length. If a value of the domain boundary length is large, it means that the domain has a small area. In other words, the thin film is polycrystalline with various orientations. On the other hand, if a value of the domain boundary length is small, it means that the domain is large in size, and that the thin film has high single crystal quality. Here, the single domain is not exactly synonymous with a single grain. However, a large value of the domain boundary length means the existence of a large number of domains, and therefore corresponds to great ununiformity of crystals in the film formation. In other words, if the domain boundary length is long, it means that a domain is small in size, and that a grain is also small in size.

Now, a condition for determining whether the domains are different domains, that is, a condition for defining a domain boundary is necessary. In the present example embodiment, the domains are regarded as having the same orientation if the difference between the rotation angles of the planes of orientation is 2° or less, and the difference between the inclination angles of the planes of orientation is 2° or less. The smaller the predetermined angle of the boundary condition for defining the domain boundary is, the more a single domain become equivalent to a single grain. However, if the predetermined angle is too small, the domains are evaluated as being different domains due to slight distortion or roughness, even if the film is practically a continuous single crystal film. This may lead to an error of measurement. Thus, the predetermined angle is preferably larger than an error of measurement of the method for measuring the crystal orientation of the domain. On the other hand, if the predetermined angle is too large, similar domains cannot be differentiated from each other, which results in lack of accuracy of the index of the domain boundary length. Thus, the predetermined angle needs to be decided in relation to the spatial resolution and unevenness of the measurement of the orientation.

In the first example embodiment, the predetermined angle for defining the domain boundary is 2°. However, as mentioned earlier, the predetermined angle is not limited to 2°, and may be about 0.5° or more and less than about 5°.

Now, a method for measuring the domain boundary length of the AlN film which forms the first coating film 23 according to the present example embodiment will be described in detail below. The crystal orientation of the AlN film can be measured by an electron backscattering diffraction pattern (EBSD or EBSP) technique. The EBSP technique is a method for evaluating a crystal orientation of a sample piece (a thin film) by irradiating the sample piece with an electron beam converging at the surface of the sample piece, and taking an image of the diffracted electron beam scattered by the surface of the sample piece.

Figure 4:
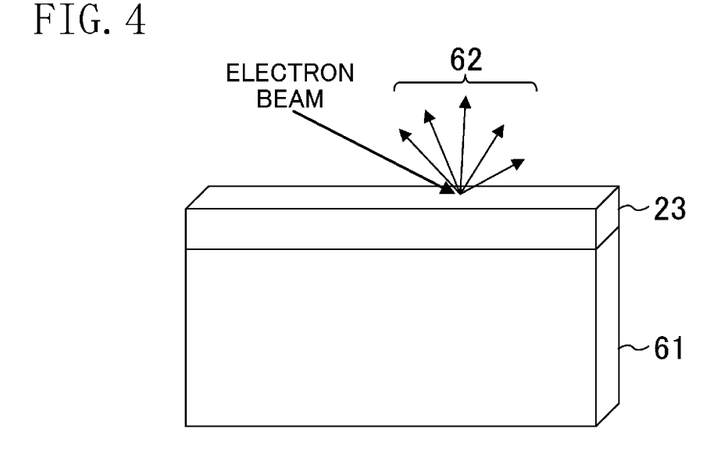
FIG. 4 is a schematic oblique view for showing a method for measuring a domain boundary length according to the present disclosure.

FIG. 4 is a schematic view for showing a measurement method according to the EBSP technique. As shown in FIG. 4, the first coating film 23 made of AlN is formed on the front facet of a so-called "laser bar 61" which is initially cleaved from a wafer provided with a laser structure such that the facet of the cavity is exposed. Here, the thickness of the first coating film 23 is 20 nm. The incoming electron beam for measurement is scattered by the lattice planes of the crystals. The scattered electron beams interfere with each other, and are detected as a strong diffracted beam 62.

Figure 5A:
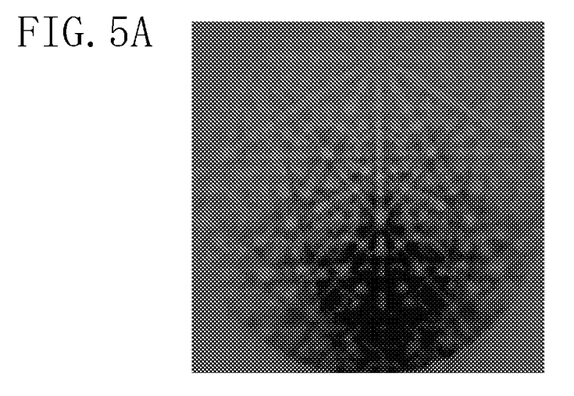
FIG. 5A is a diffraction image of the AlN film having c-axis orientation.
Figure 5B:
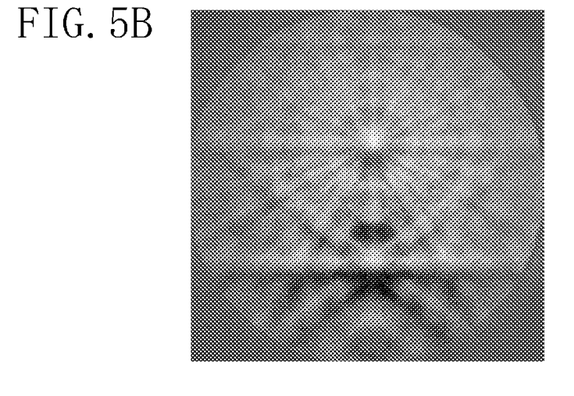
FIG. 5B is a diffraction image of the AlN film having m-axis orientation.

FIG. 5A and FIG. 5B show EBSP diffraction images of the first coating films (AlN films) 23 each having a different orientation axis. FIG. 5A shows a measurement result corresponding to the AlN having c-axis orientation. FIG. 5B shows a measurement result corresponding to the AlN having m-axis orientation. As shown in the drawings, even if the crystalline structures are the same, it is possible to evaluate crystal orientations because diffraction patterns are different due to differences of orientation. Here, the electron beam is applied at accelerated speed of about 10 keV to 30 keV, and the electron beam is converged at an area having a diameter of about 20 nm to 50 nm. The converged electron beam is scanned within a desired area to obtain a two-dimensional crystal orientation map. A diffraction image of the scattered electron beam (diffracted beams 62) is taken by a CCD camera.

In the EBSP measurement technique according to the present example embodiment, the scan region of the electron beam is 1 μm×1 μm, and the scan interval of the electron beam is 10 nm. Further, the acceleration energy of the electron beam is 20 keV. In FIG. 4, an incident angle of the incoming electron beam relative to the laser bar 61 as a sample piece is 70°.

Figure 6:
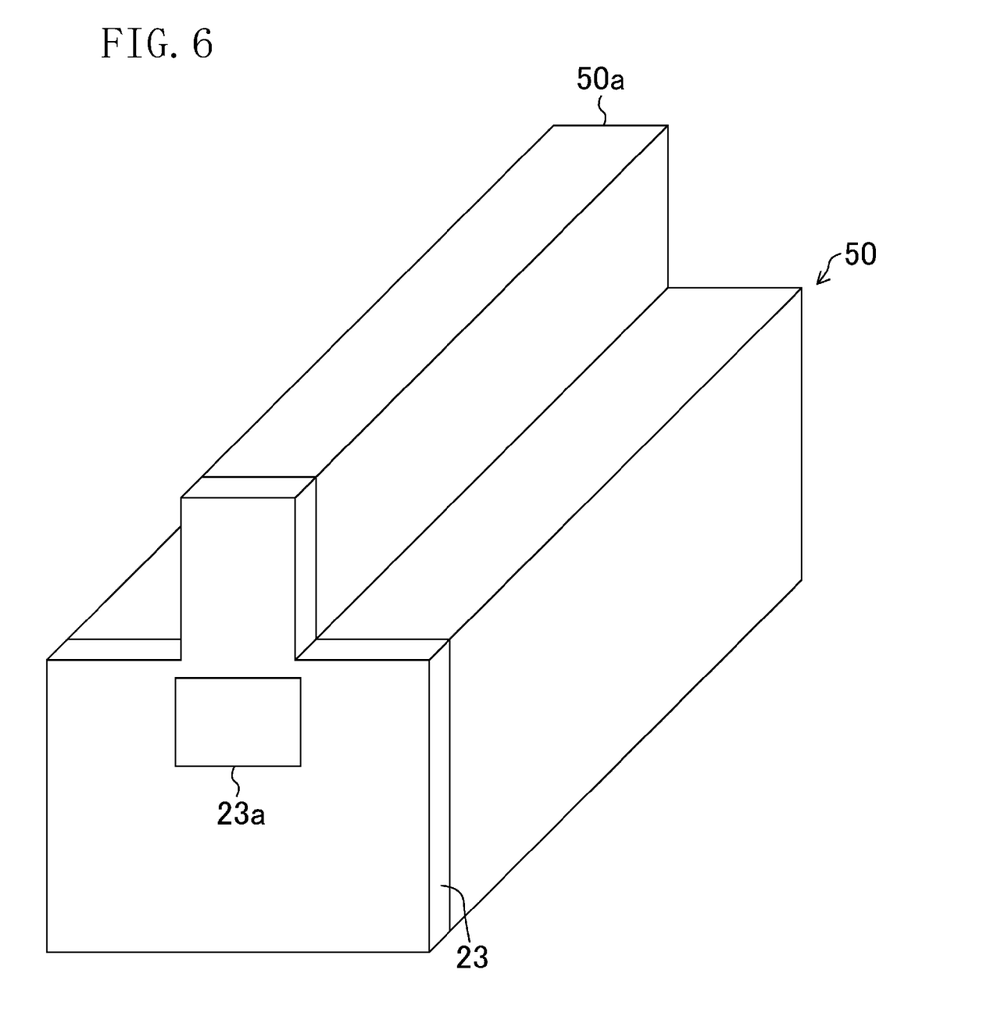
FIG. 6 is a schematic oblique view for showing an area of the first coating film according to the first example embodiment of the present disclosure, at which area the domain boundary length is measured.

FIG. 6 shows a schematic view of a semiconductor laser diode according to the first example embodiment on which the first coating film 23 is formed. It is a light emitting area 23a of the first coating film 23 located at a lower position relative to the ridge waveguide 50a that is measured by the EBSP technique according to the present example embodiment. Of the multilayer semiconductor structure 50 in contact with the first coating film 23, only the light emitting area 23a and its peripheral area are subjected to the deterioration and optical damage at the facet. Thus, the evaluation of the crystal orientation of the first coating film 23 may be conducted mainly at the light emitting area 23a. However, if the crystal orientation of only the first coating film 23 is to be evaluated, the area does not have to be limited to the light emitting area 23a, but can be anywhere on the facet of the multilayer semiconductor structure 50.

FIG. 7A to FIG. 7D show two-dimensional EBSP maps of the first coating films 23 made of AlN which are formed under four different film formation conditions. Here, a boundary between domains of which the difference between the inclination angles or the rotation angles of the planes of crystal orientation is 2° or more is shown in solid line. As mentioned above, the measurement area is a square region with sides of 1 μm. The domain boundary length is shown under each map.

As a film formation condition of the ECR sputtering, argon (Ar) is used as a reference gas in each case, and the flow rate of the Ar gas is 20 ml/min (normal state). On the other hand, the flow rate of the nitrogen ($N_2$) gas as a reactive gas is 3.5 ml/min (normal state) in FIG. 7A, 5.5 ml/min (normal state) in FIG. 7B, 10 ml/min (normal state) in FIG. 7C, and 15 ml/min (normal state) in FIG. 7D. Here, the "ml/min (normal state)" is a unit for representing a flow rate of gas, and 1 ml/min (normal state) represents the state in which a gas flows 1 ml per minute in terms of gas at 0° C. and 1 atmospheric pressure (i.e., gas under normal state).

Figure 7A:
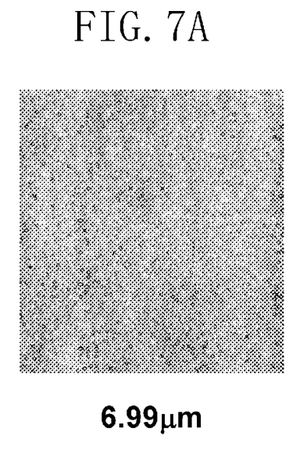
FIG. 7A to FIG. 7D are two-dimensional EBSP maps of AlN films according to the first example embodiment of the present disclosure, each AlN film being formed under a different condition.
Figure 7B:
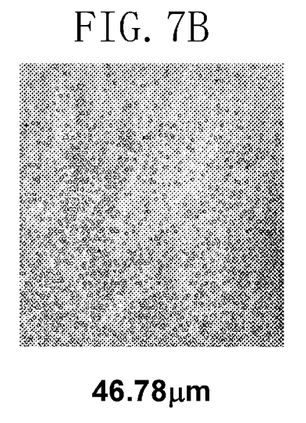
Figure 7C:
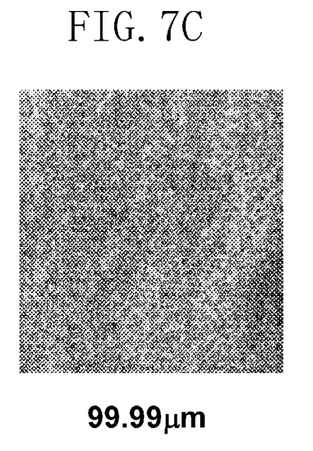
Figure 7D:
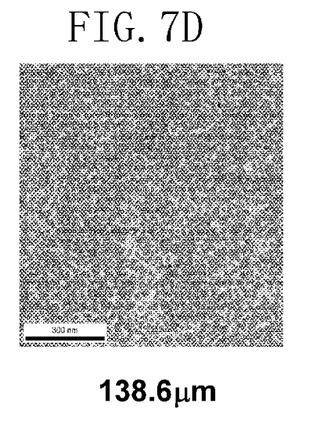

The two-dimensional EBSP map of FIG. 7A shows a film formation condition in which the partial pressure of the nitrogen is the lowest, and the domain boundary length per unit area (1 $\mu m^2$) is represented by a small value, that is, 6.99 $\mu m/\mu m^2 (=\mu m^{-1})$. On the other hand, the AlN film shown in FIG. 7D which is formed under a film formation condition in which the partial pressure of the nitrogen is the highest, has very small grains, and the domain boundary length is represented by a large value, that is, 138.6 $\mu m^{-1}$. Thus, the domain boundary length tends to increase as the flow rate of nitrogen gas increases. In other words, it is recognized that grains tend to be small in size as the flow rate of nitrogen gas increases.

Figure 8:
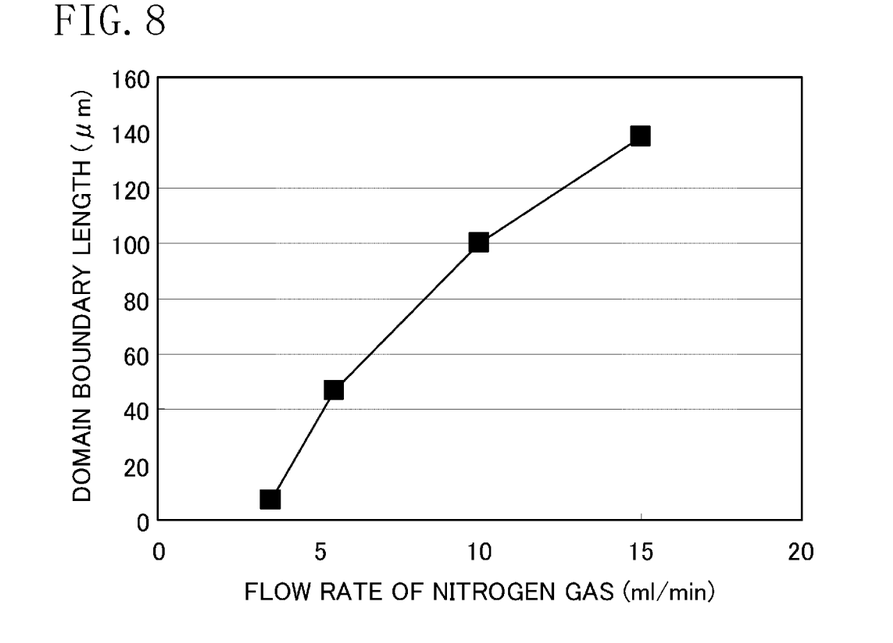
FIG. 8 is a graph showing a relationship between the flow rate of nitrogen and the domain boundary length during the formation of the AlN film according to the first example embodiment of the present disclosure.

FIG. 8 shows a relationship between the flow rate of nitrogen gas and the domain boundary length in the case where the flow rate of the Ar gas is 20 ml/min (normal state). As mentioned above, the domain boundary length increases as the flow rate of nitrogen gas increases.

The inventors of the present application studied various film formation conditions to find a film formation condition under which the domain boundary length is further reduced. As a result, the inventors of the present application found that if the flow rate of Ar gas was 30 ml/min (normal state), and the flow rate of nitrogen gas was 5.2 ml (normal state), it was possible to obtain an AlN film having very high single crystal quality in which the domain boundary length was 1 $\mu m^{-1}$ or less.

Figure 9:
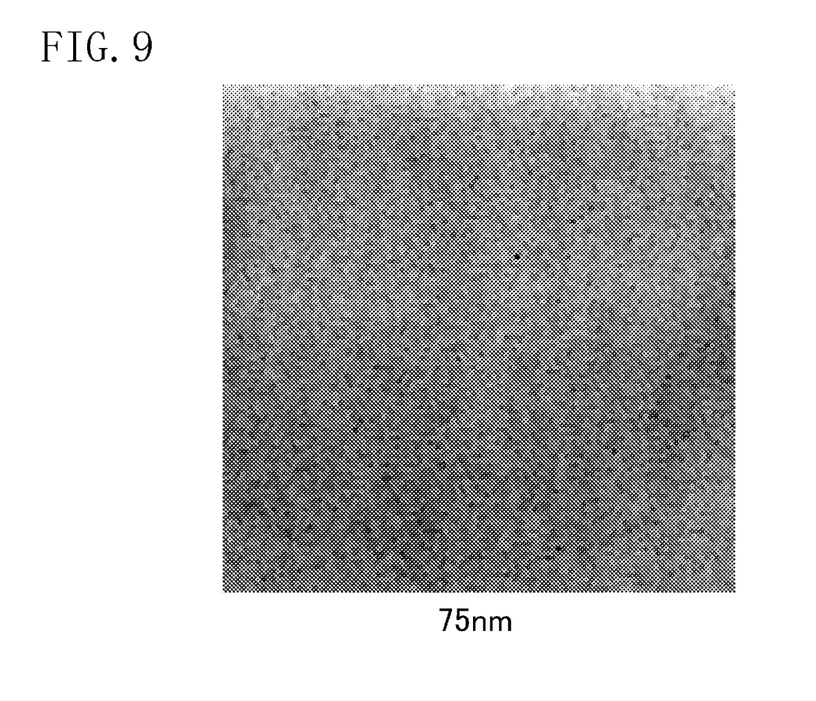
FIG. 9 is a preferable two-dimensional EBSP map of an AlN film according to the first example embodiment of the present disclosure.

FIG. 9 shows a two-dimensional EBSP map of an AlN film obtained when the flow rate of Ar gas is 30 ml/min (normal state), and the flow rate of nitrogen gas is 5.2 ml (normal state). It is acknowledged that the domain boundary length in this case is very short, that is, 75 nm, and that the AlN film has very high single crystal quality. However, the conditions for obtaining such an AlN film having high single crystal quality are not limited to the above condition.

Figure 10:
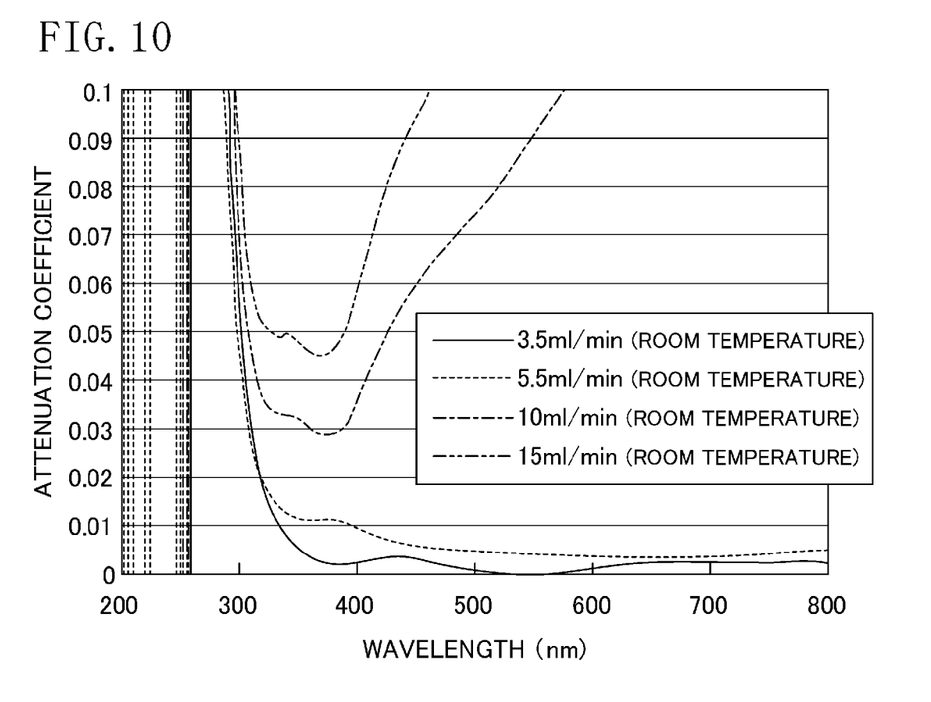
FIG. 10 is a graph of attenuation coefficient spectra when AlN films according to the first example embodiment of the present disclosure are formed at different flow rates of nitrogen.
Figure 11:
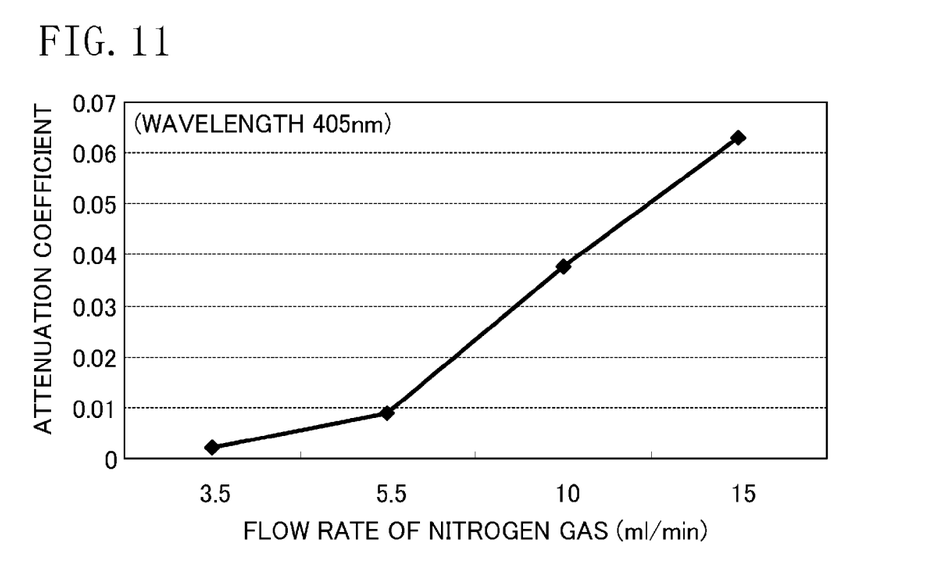
FIG. 11 is a graph showing the case in which the wavelength of the attenuation coefficient spectra of the AlN films according to the first example embodiment of the present disclosure, the AlN films being formed at different flow rates of nitrogen gas, is 405 nm.

Now, the results of checking the attenuation coefficients (light absorption coefficients) of the AlN films shown in FIG. 7A to FIG. 7D will be described. FIG. 10 shows attenuation coefficient spectra obtained from the transmission spectra of the AlN films. FIG. 11 shows a relationship between the attenuation coefficient and the flow rate of nitrogen gas when the wavelength of light used in a Blu-ray Disc (registered trademark) is 405 nm.

As shown in FIG. 10, the attenuation coefficients increase as the flow rates of nitrogen gas increase. Further, as shown in FIG. 11, the attenuation coefficient in the case where the light having a wavelength of 405 nm is used also increases as the flow rate of nitrogen gas increases. That is, comparison between FIG. 8, FIG. 10 and FIG. 11 shows that the attenuation coefficient tends to increase as a value of the domain boundary length increases.

Figure 12:
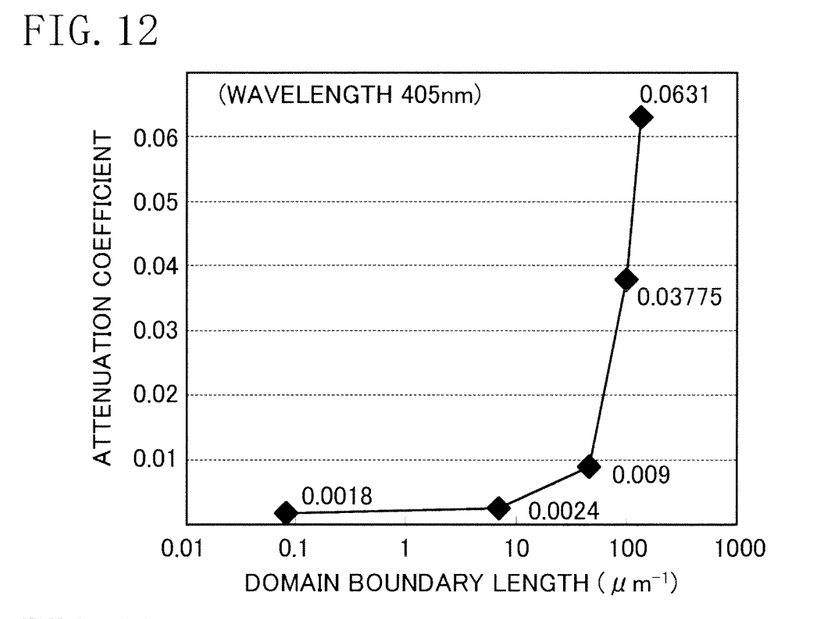
FIG. 12 is a graph showing a relationship between the attenuation coefficient and the domain boundary length when the wavelength of AlN film according to the first example embodiment of the present disclosure is 405 nm.

FIG. 12 shows a relationship between the domain boundary length and the attenuation coefficient in the case where the light having a wavelength of 405 nm is used. When the domain boundary length exceeds 7 $\mu m^{-1}$, the attenuation coefficient sharply increases. In other words, the longer the grain boundary length is, that is, the more the number of small domains increases, the more light is absorbed. In general, light adsorption is considered to occur in a visible light region of an AlN film due to an intermediate level induced by a defect in the crystal, a grain boundary, and an interface between domains. A lot of defects and dangling bonds exist particularly at the grain boundary and the interface between domains, and they may be a main cause of the light absorption in the visible light region. Thus, it is considered that the longer the domain boundary length is, the more light tends to be absorbed as shown in FIG. 12.

Now, a relationship between the domain boundary length and reliability of the semiconductor laser diode will be described.

Figure 13:
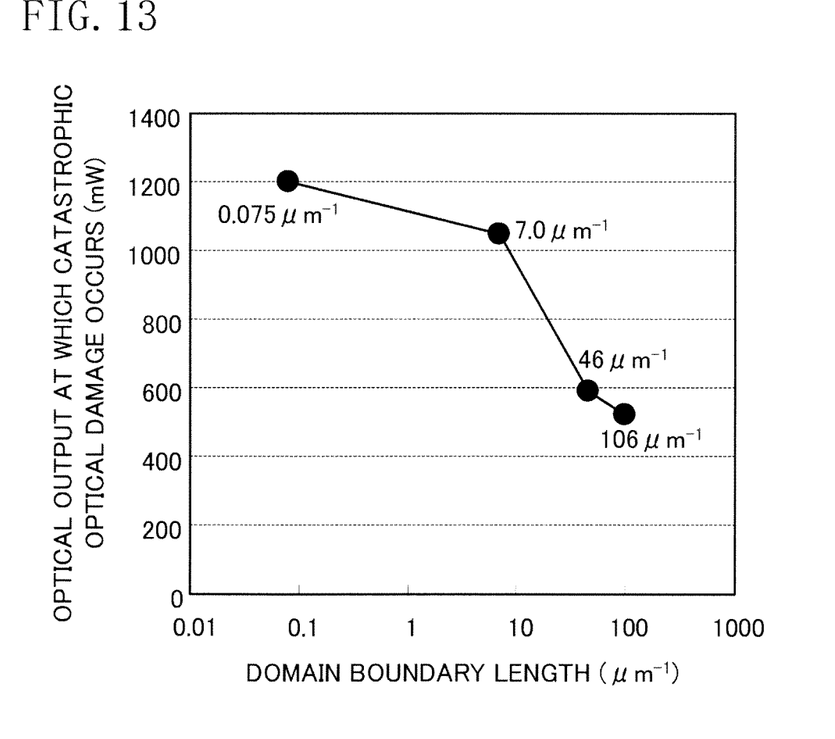
FIG. 13 is a graph showing a relationship between the domain boundary length and an optical output causing optical damage, in a nitride semiconductor light-emitting device using the AlN film according to the first example embodiment of the present disclosure as a protection film.

FIG. 13 shows a relationship between a domain boundary length and an optical output level causing catastrophic optical damage (COD) after 600 hour operation at a temperature of 70° C., in testing for reliability after continuous operation at a constant optical output of 160 mW. As shown in FIG. 13, a value of the optical output causing optical damage increases as the domain boundary length decreases. Therefore, reliability is high. In other words, the shorter the domain boundary length becomes, that is, the larger the domain size is, the higher the reliability is. The value of the optical output causing optical damage sharply increases particularly in the area where the domain boundary length is from 46 $\mu m^{-1}$ to 7 $\mu m^{-1}$.

As described earlier, if the domain boundary length is long, the domain is small in size, and the light absorption increases. This may be a consequence of an intermediate level or a dangling bond induced by a defect existing in a domain boundary. Further, if such an intermediate level exists, non-radiative recombination of carriers injected from an electrode increases, and luminous efficiency is lowered. Both of the light absorption due to an intermediate level, and the non-radiative recombination through the intermediate level are processes in which heat is generated. This may increase the temperature of the facet of the cavity, and cause a facet breakdown.

Thus, if the domain boundary length is 46 $\mu m^{-1}$ or less, the attenuation coefficient is very small, which is 0.01 or less as indicated by the relationship shown in FIG. 12. In other words, the domain boundary length of the AlN film as a facet protection film needs to be 46 $\mu m^{-1}$ or less.

Further, if the domain boundary length is 7 $\mu m^{-1}$ or less, the optical output causing optical damage occurs is maintained at a high level as indicated by the relationship shown in FIG. 13. For this reason, the domain boundary length is preferably 7 $\mu m^{-1}$ or less. The domain boundary length is an average index for representing a domain size in the AlN film. However, a facet breakdown actually occurs in a light transmission area from which light is emitted. Thus, light absorption occurs if a domain boundary exists in the light transmission area. It is possible to consider that the reason why high reliability can be achieved when the domain boundary length is 7 $\mu m^{-1}$ or less is that the density of interfaces between the domains is reduced and less number of domain interfaces exist in the laser light transmission area.

Figure 14:
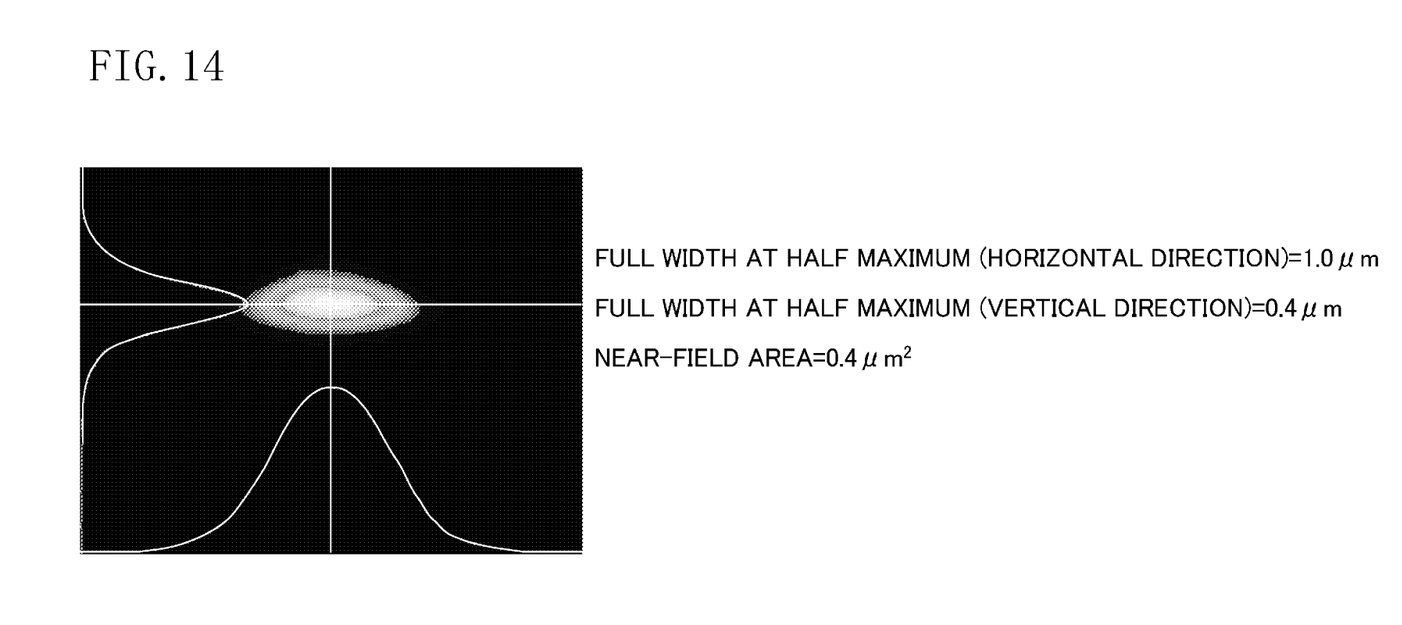
FIG. 14 shows the light intensity distribution of a light-emitting facet of a nitride semiconductor light-emitting device according to the first example embodiment of the present disclosure.

As shown in FIG. 14, the area of the light transmission area of the first coating film of the semiconductor laser diode according to the first example embodiment is about 0.4 $\mu m^2$. In the following description, it is calculated what a value of the domain boundary length would be if each domain has an area of 0.4 $\mu m^2$ and there are 2.5 domains per unit area (1 $\mu m^2$).

As shown in FIG. 14, the laser light has a full width at half maximum of about 1.0 $\mu m$ in a horizontal direction, and has a full width at half maximum of 0.4 $\mu m$ in a vertical direction. This means that there can exist 2.5 rectangles having a long side of 1.0 $\mu m$ and a short side of 0.4 $\mu m$ in the unit area of 1 $\mu m^2$. The maximum value of the domain boundary length in this case is 5.0 $\mu m^{-1}$. In order that the domain size is larger than the beam size of the laser light, the domain boundary length has to be 5 $\mu m^{-1}$ or less. As described above, it is possible to provide a laser diode having high reliability if the domain size is 7 $\mu m^{-1}$ or less. However, to provide a laser diode having higher output power, the domain size needs to be larger, that is, an AlN film having high single crystal quality is required. In this case, the domain size may be larger than the beam size of the laser light. In the nitride semiconductor laser diode according to the present example embodiment, the domain boundary length is preferably 5.0 $\mu m^{-1}$. In other words, an AlN film having a domain larger than 0.4 $\mu m^2$ is preferable.

The domain boundary length of the AlN film according to the first example embodiment is 75 nm as shown in FIG. 9. Further, as shown in FIG. 12, the AlN film is a transparent film whose attenuation coefficient is 0.002 or less, and has high single crystal quality. Therefore, as shown in FIG. 13, the optical output causing optical damage is maintained at a very high level even after continuous operation for 600 hours at an optical output of 160 mW.

Second Example Embodiment

The second example embodiment of the present disclosure will be described below with reference to the drawings.

In general, a GaN based semiconductor laser diode is epitaxially grown on a substrate for crystal growth, the substrate having a hexagonal crystalline structure of which the main surface is a c-plane of the plane orientation. In this case, the facet of the cavity of the laser structure is formed by cleavage. Therefore, the plane orientation of the cleaved facet is an m-plane.

In the case where an AlN film is formed on the facet of the cavity which has an m-plane, it is possible to choose m-axis growth having the same orientation as the crystalline structure of the facet of the cavity, or c-axis growth having an orientation different from the crystalline structure of the facet of the cavity, depending on film formation conditions.

In the case of aluminum nitride (AlN), a hexagonal crystalline structure is the most stable structure, and the growth rate of the AlN film is highest when the AlN film is formed along c-axis. Therefore, the AlN film is known to be grown along c-axis when it is formed on an amorphous underlying layer or on a silicon (Si) substrate. However, the inventors of the present application found that if the underlying layer has a hexagonal crystalline structure and an m-plane, it was possible to grow the AlN film along m-axis by increasing an ion energy during the film formation.

It is possible to choose whether a protection film made of AlN has c-axis or m-axis crystal orientation. Accordingly, c-axis growth or m-axis growth of an AlN film having a small value of the domain boundary length will be described in the second example embodiment.

As explained in the first example embodiment, there is a connection between the reliability of the nitride semiconductor laser diode and the domain boundary length of the crystals which form the protection film. Here, regardless of whether the protection film (i.e., the first coating film 23) has m-axis orientation or c-axis orientation, the attenuation coefficient increases as a value of the domain boundary length increases, and the optical output causing optical damage becomes low with operation time. However, the results of distortion analyses described below show that less stress tends to be applied to multilayer semiconductor structure 50 in the case of m-axis orientation, than in the case of the c-axis orientation.

Figure 15:
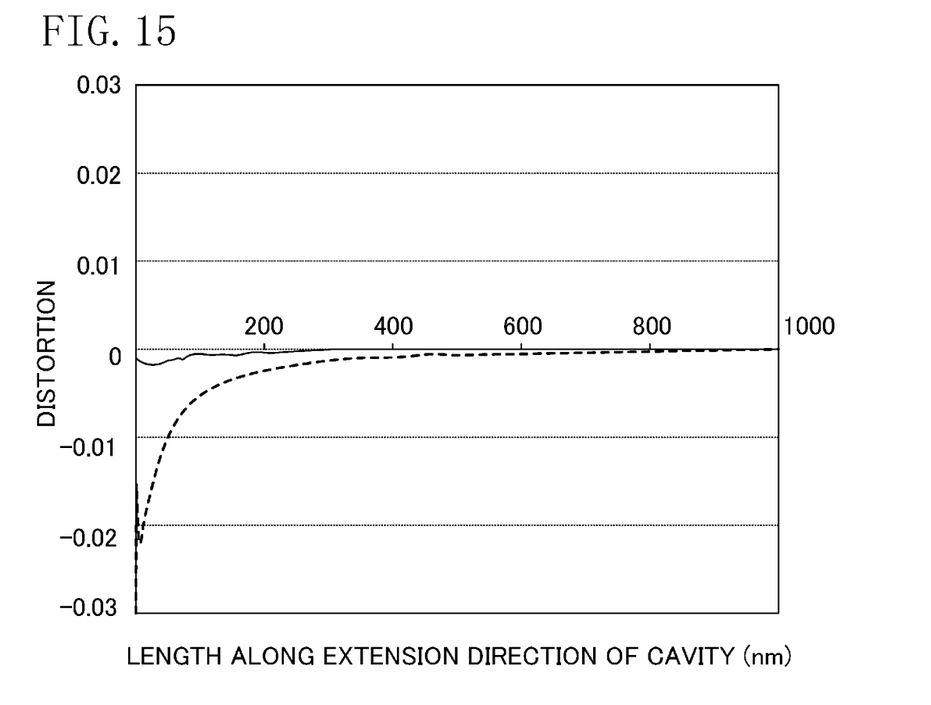
FIG. 15 is a graph showing a relationship between the distortion applied to a GaN based semiconductor by the AlN film according to the present disclosure, and a length of a cavity from its facet.

FIG. 15 shows the results of distortion analyses conducted on an AlN film having m-axis orientation and an AlN film having c-axis orientation by the EBSP technique. FIG. 15 shows that, if the AlN film having m-axis orientation and the AlN film having c-axis orientation are each formed on the m-plane of the GaN crystal by ECR sputtering, how the GaN crystal is affected by the distortion in an m-axis direction. The graph in solid line corresponds to the AlN film having m-axis orientation, and the graph in broken line corresponds to the AlN film having c-axis orientation. The flow rate of Ar gas for forming the AlN film having m-axis orientation is 8 ml/min (normal state), and the flow rate of $N_2$ gas is 5.5 ml/min (normal state). These conditions are one of film formation conditions for the AlN film having m-axis orientation which the inventors of the present application found, and the film formation conditions for the AlN film having m-axis orientation are not limited to these conditions. Further, the flow rate of Ar gas for forming the AlN film having c-axis orientation is 20 ml/min (normal state), and the low rate of $N_2$ gas is 5.5 ml/min (normal state).

As shown in FIG. 15, the AlN film having m-axis orientation has smaller distortion than the AlN film having c-axis orientation. This may be because threading dislocations occur in the AlN film having m-axis orientation, and stress is reduced compared to the AlN film having c-axis orientation. Thus, it is possible to say that the AlN film having m-axis orientation has less effect of stress on the GaN crystal than the AlN film having c-axis orientation. However, a value of the domain boundary length increases if threading dislocations occur in the AlN film, and therefore, the AlN film having c-axis orientation is suitable as a facet protection film.

Moreover, the threading dislocations are more likely to occur as the film thickness increases. Thus, a thin first AlN film having m-axis orientation may be formed as a lower layer, and a second AlN film having c-axis orientation may be formed thereafter on the first AlN film as an upper layer, to obtain a two-layered AlN film (a first coating film).

Now, a method for forming an AlN film having m-axis orientation or c-axis orientation will be described.

As described above, the growth rate of the AlN film is high when the AlN film is formed along c-axis. Thus, the AlN film will be voluntarily oriented along c-axis if the AlN film does not rely on an underlying material. In the case where the AlN film is grown on a substrate whose main surface is m-plane, the AlN film follows, like epitaxial growth, the crystalline structure of the underlying material, and therefore, certain energy is required. Thus, in the case of ECR sputtering, increasing the energy of Ar ions which assist the formation of the AlN film is effective. To increase the energy of the Ar ions, the RF power and the output power of microwave for generating plasma may be increased.

In the first example embodiment, the RF power and the microwave are output at 500 W to form the AlN film having c-axis orientation. Thus, the AlN film having m-axis orientation can be formed by setting the RF power to 600 W.

Further, reducing the pressure in the chamber during the film formation is also effective in forming the AlN film having m-axis orientation. The inventors of the present application found that the m-axis growth of the AlN film is promoted by increasing the acceleration energy of ions as described above. For example, in the first example embodiment, the flow rate of Ar gas is 20 ml/min (normal state) or 30 ml/min (normal state) for film formation. Thus, in the second example embodiment, the flow rate of Ar gas is reduced to 8-10 ml/min (normal state) so that the whole pressure in the chamber is reduced, thereby generating Ar ions having higher ion energy. The AlN film having m-axis orientation can be formed with an assist of these Ar ions.

As described above, the orientation of the AlN film can be controlled under the film formation conditions, and thus, it is possible to form an AlN film having higher single crystal quality. As a result, it is possible to achieve a nitride semiconductor laser diode having high reliability.

In the first and second example embodiments, a semiconductor laser diode using a group III nitride (i.e., a GaN based semiconductor) was described. However, the present disclosure is effective in increasing the reliability of a light emitting diode using a group III nitride semiconductor, because in the light emitting diode, too, oxidation of the nitride semiconductor and external diffusion of nitrogen occur at the light-emitting facet of the device during operation, which leads to an increase in leakage current at the light-emitting facet, and a reduction in luminous efficiency.

Further, the present disclosure is effective not only for a semiconductor light-emitting device using a group III nitride semiconductor, but also for a semiconductor light-emitting device using GaAs or InP, because in the semiconductor light-emitting device using GaAs or InP, too, the oxidation of semiconductor and the external diffusion of the semiconductor atoms occur at the light-emitting facet during operation, which leads to deterioration of the facet.

A nitride semiconductor light-emitting device according to the present disclosure has a facet protection film in which less light absorption occurs and no optical damage is caused even during a high power output operation, and is suitable for a nitride semiconductor light-emitting device having a long life and high reliability.

What is claimed is:

1. A nitride semiconductor light-emitting device, comprising:
   a multilayer semiconductor structure made of a group III nitride semiconductor and having a light-emitting facet; and
   a first protection film formed to cover the light-emitting facet of the multilayer semiconductor structure, wherein
   the first protection film is a crystalline film made of a nitride containing aluminum,
   the crystalline film is comprised of a group of single domains,
   the single domain is comprised of a group of grains whose crystal orientation planes have a same inclination angle and a same rotation angle, and
   a length of a boundary between the domains per unit area is 7 $\mu m^{-1}$ or less.

2. A nitride semiconductor light-emitting device, comprising:
- a multilayer semiconductor structure made of a group III nitride semiconductor and having a light-emitting facet, and
- a first protection film formed to cover the light-emitting facet of the multilayer semiconductor structure, wherein
- the first protection film is a crystalline film made of a nitride containing aluminum,
- the crystalline film is comprised of a group of single domains,
- the single domain is comprised of a group of grains whose crystal orientation planes have a same inclination angle and a same rotation angle, and
- part of the plurality of domains which is opposed to a light transmission area of the light-emitting facet has an area larger than an area of the light transmission area.

3. The nitride semiconductor light-emitting device of claim 1, wherein the first protection film includes single domains in which a difference between the inclination angles of the crystal orientation planes is 2° or less, and a difference between the rotation angles of the crystal orientation planes is 2° or less.

4. The nitride semiconductor light-emitting device of claim 1, wherein the first protection film has a crystalline structure whose crystal axis orientation is the same as a crystal axis orientation of the multilayer semiconductor structure.

5. The nitride semiconductor light-emitting device of claim 1, wherein the first protection film has a crystalline structure whose crystal axis orientation is different from a crystal axis orientation of the multilayer semiconductor structure.

6. The nitride semiconductor light-emitting device of claim 1, wherein
- the multilayer semiconductor structure has a hexagonal crystalline structure,
- the light-emitting facet is an m-plane, and
- the first protection film has a c-axis orientation.

7. The nitride semiconductor light-emitting device of claim 1, further comprising:
- a second protection film formed to cover the first protection film, wherein
- the second protection film is an amorphous film containing oxygen.

8. The nitride semiconductor light-emitting device of claim 1, wherein the length of the boundary between the domains is 0.075 $\mu m^{-1}$ or more.

9. The nitride semiconductor light-emitting device of claim 1, wherein an attenuation coefficient is 0.01 or less.

* * * * *